United States Patent

[11] 3,588,547

[72] Inventor Carl Greenblum
Stamford, Conn.
[21] Appl. No. 840,741
[22] Filed July 10, 1969
[45] Patented June 28, 1971
[73] Assignee The Bunker-Ramo Corporation
Stamford, Conn.

[54] PULSE DELAY CIRCUIT
10 Claims, 2 Drawing Figs.

[52] U.S. Cl. .................................................... 307/293, 307/265, 307/267, 307/268, 328/55, 328/58
[51] Int. Cl. .................................... H03k 17/26, H03k 1/14
[50] Field of Search .......................................... 307/263, 265, 267, 268, 293; 328/55, 58

[56] References Cited

UNITED STATES PATENTS 3,007,060 10/1961 Guenther ..................... 307/293X
3,244,907 4/1966 Daigle, Jr. 307/293X
3,504,288 3/1970 Ross 307/293X

*Primary Examiner*—Stanley D. Miller, Jr
*Attorney*—Frederick M Arbuckle

ABSTRACT: A circuit for providing a relatively large and easily varied delay of randomly received pulses without causing significant distortion of the pulse shape. The leading edge of the pulse is converted into a first decaying pulse and the trailing edge into a second decaying pulse. These decaying pulses, which are of opposite polarity, are applied to a summing point, the other input to which is a reference pulse which begins and ends at the same time as the input pulse and is of the same polarity as the second decaying pulse. The summing point is the input to a threshold circuit which is adapted to start generating an output when the first decaying pulse has decayed to a first predetermined value and to stop generating an output when the second decaying pulse has decayed to a second predetermined value. The output from the threshold circuit is the desired delayed pulse.

INVENTOR
BY CARL GREENBLUM

Ronald J. Kransdorf
ATTORNEY

PULSE DELAY CIRCUIT

PULSE DELAY CIRCUIT

This invention relates to a pulse delay circuit, and more particularly to a circuit which provides a relatively large, and easily varied delay of randomly received pulses, without causing significant distortion of the pulse shape.

Traditional pulse delay circuits are composed either of R.C. or L.C. networks or of clocked shift-register stages. While these delay circuits are satisfactory for certain applications, each suffers a number of limitations. The networks require a large number of stages in order to achieve significant delays and are therefore quite expensive. Further, since pulse rise time and pulse fall time increase significantly as the delay increases, resulting output pulses have very poor rise and fall characteristics. This tends to severely restrict the amount of delay which a circuit of this type can introduce without utilizing additional reshaping circuitry. Finally, substantial effort is generally required in order to accommodate variations in the delay while still maintaining desired rise and fall times. Delays using clocked shift-register stages are also expensive and suffer from the further limitations that they cannot handle randomly received inputs or inputs of variable width.

It is therefore apparent that a new pulse delay technique is required which permits the delay of randomly received pulses of variable width and repetition rate without causing any distortion in pulse rise or fall time. Such a circuit should also permit the amount of delay to be easily varied over a relatively wide range, at least equal to the pulse width. There are also applications which require a capability to vary the pulse delay as a function of time so as to permit the pulse position to be varied. Such a pulse could, for example, serve as a search window in radar applications. Other applications require a capability to both delay the pulse and expand its width. Finally, the improved delay circuit should be relatively simple and inexpensive.

It is therefore a primary object of this invention to provide an improved pulse delay circuit.

A more specific object of this invention is to provide a pulse delay circuit which is capable of accepting randomly received pulses of variable width and repetition rate.

A still more specific object of this invention is to provide a pulse delay circuit of the type indicated above which does not introduce any significant distortion in pulse rise and pulse fall time.

Another object of this invention is to provide a pulse delay circuit of the type indicated above in which the delay may be varied over a fairly wide range.

Still another object of this invention is to provide a pulse delay circuit of the type indicated above in which the delay may be easily varied as a function of time.

Another object of this invention is to provide a pulse delay circuit of the type indicated above in which the width of the pulse may also be expanded by a controlled amount.

A further object of this invention is to provide a pulse delay circuit of the type indicated above which is relatively simple and inexpensive.

In accordance with these objects this invention provides a pulse delay circuit which includes a means responsive to the leading edge of the pulse for generating a first decaying pulse and responsive to the trailing edge of the pulse for generating a second decaying pulse. The first decaying pulse decays to a first predetermined value in a time Tl while the second decaying pulse decays to a second predetermined value in a time T2. The first and second decaying pulses are of opposite polarity. In a preferred embodiment of the invention, T1 and T2 are equal. The circuit also includes a means for generating a reference pulse of the same polarity as the second decaying pulse, which reference pulse begins and ends at the same time as the input pulse. The first and second decaying pulses and the reference pulse are applied to a summing point which point serves as the input to a threshold circuit. The threshold circuit is adapted to start generating an output when its input is equal to the value of the reference pulse minus the first predetermined value and to stop generating an output when its input is equal to the second predetermined value. The output from the threshold circuit is thus a delayed version of the input pulse, the delay being equal to the time T where T=T1.

The foregoing and other objects, features and advantages of the invention will be apparent from the following, more particular description of a preferred embodiment of the invention as illustrated in the accompanying drawings.

Figure 1:
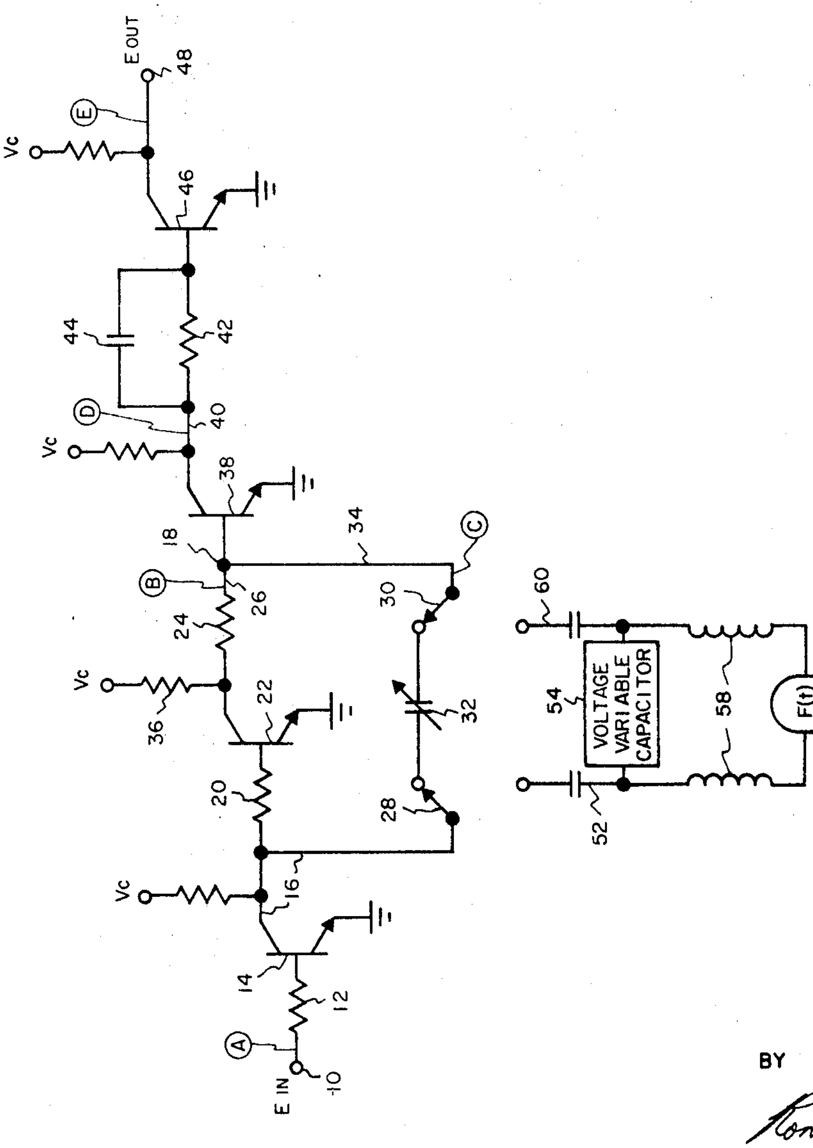
FIG. 1 is a semiblock schematic diagram of a preferred embodiment of the invention.

Referring now to FIG. 1, it is seen that the pulse which is to be delayed is applied through input terminal 10 and resistor 12 to the base of transistor 14. This pulse is shown on line A of FIG. 2. Except for limitations to be described later, the amplitude, width, and repetition rate of the pulse are not critical. Transistor 14 serves to invert the input pulse and also serves as a pulse limiter to apply a standardized driving pulse to the delay circuit proper. The inverted output pulse on line 16 from transistor 14 is applied to summing point 18 through two parallel paths. The signal on line 16 is applied through resistor 20 to the base of transistor 22. Transistor 22 inverts the pulse applied to it and generates an output which is the same as the input pulse except for amplitude. This pulse, which is applied through resistor 24 and line 26 to summing point 18, is shown on line B of FIG. 2. It will be assumed that this pulse is of known amplitude (2V).

The pulse on line 16 is also applied to switch 28. For purposes of the present discussion, it will be assumed that switches 28 and 30 are in the position shown in FIG. 1. The pulse on line 16 is therefore applied through switch 28, capacitor 32, switch 30 and line 34 as the second input to summing point 18. The output from capacitor 32 on line 34 is shown on line C of FIG. 2. From this FIG. it is seen that the leading edge of the inverted pulse causes a negative output pulse from capacitor 32 which rises to a given value and then decays in a time T1, to a first predetermined value which, for purposes of the present discussion will be assumed to be V. Similarly, the trailing edge of the inverted input pulse on line 16 causes a positive output pulse from capacitor 32 which pulse starts at a given value and decays to a second predetermined value in a time T2. The second predetermined value will also be assumed to be V. The parameters of various circuit elements including capacitor 32, resistor 34, and collector resistor 36 may be selected such that T1 and T2 are equal. Therefore, unless otherwise indicated in the discussion to follow, it will be assumed that the pulse delay is equal to T where T=T1=T. In order to make the time constants T1 and T2 equal in certain critical applications, an emitter follower consisting of a single transistor stage may be interposed between summing point 18 and transistor 38. Thus the loading effect of the summing point may be made to be practically constant.

Figure 2:
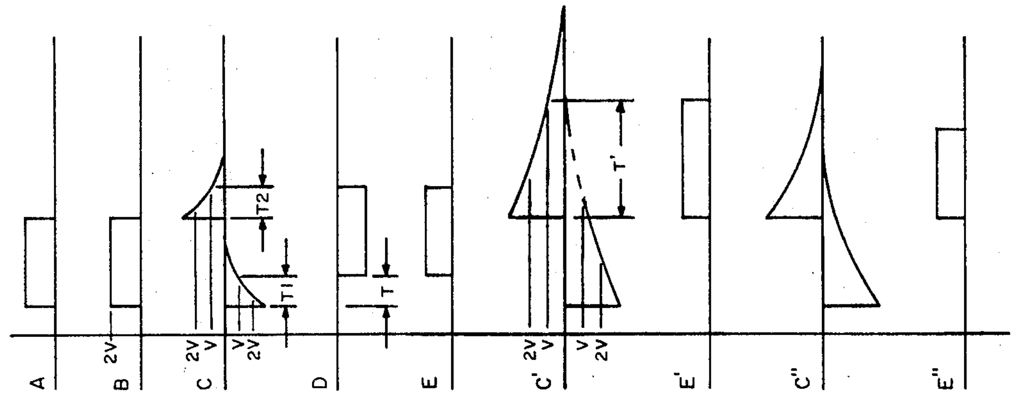
FIG. 2 is a diagram illustrating the waveforms appearing at various points in the circuit of FIG. 1 under different operating conditions.

The potential at point 18 is the base potential for transistor 38. In the circuit of this invention, transistor 38 is utilized as a threshold device which starts conducting when its base potential exceeds V and stops conducting when its base potential drops below this value. The base potential of transistor 38 at point 18 is obtained by combining the potentials on lines B and C of FIG. 2. When this is done, it is seen that the value of the combined pulse does not reach V until a time T after the input pulse is received. This is the time at which the negative decaying pulse from capacitor 32 decays to a value of −V. Therefore, the leading edge of the output pulse from transistor 38 on line 40 is delayed by a time T from the leading edge of the input pulse. Similarly, the potential at point 18 does not drop to a value of V until a time T after the termination of the input pulse. It is at this time that the value of the second decaying pulse from capacitor 32 drops to this value. Transistor 38 of course also inverts its input. Therefore, the output pulse from transistor 38 on line 40, which pulse is shown on line D of FIG. 2, is an inverted version of the input pulse delayed by a time T from the input. This pulse will normally not have a high speed transitions since the base voltage varies in an approximately linear manner (the beginning portion of the decay curve from capacitor 32 being approximately linear).

The pulse on line 40 is applied through a speedup circuit, consisting of resistor 42 and capacitor 44, to the base of transistor 46. Transistor 46 reestablishes proper signal polarity and, in conjunction with the speedup circuit, makes the output transitions very fast. The desired delayed output pulse is obtained at output terminal 48. This pulse is shown on line E at FIG. 2.

From FIG. 2 it is apparent that if the value of capacitor 32 is lowered so as to decrease the decay time of its output, the decaying pulse on line 34 will decrease to a value of V in less than the time shown and the delay time T will be reduced. Similarly, if the capacitor value is increased so as to increase its decay time, the value of T will be increased. The pulse delay which is introduced by the circuit may thus be easily varied by varying the value of a single capacitor.

It is also apparent that the circuit is substantially unaffected by variations in pulse width and pulse repetition time and that the amplitude of the input pulse may be varied within the limiting capabilities of transistor 14. If greater pulse amplitude variations are anticipated than can be handled by transistor 14, a pulse normalizer circuit may be inserted between terminal 10 and resistor 12. There are two limitations on what has been stated above. First, if the space between pulses is less than T, capacitor 34 will be driven sharply negative before it has decayed sufficiently to extinguish threshold transistor 38, and the resulting output pulse will be shorter than desired by an amount which is equal to the difference between T and the amount by which the two pulses are actually spaced. Similarly, if the pulse width is less than T, capacitor 32 will not have an opportunity to decay to a value of −V before it is recharged by the trailing edge of the input pulse. The outputs on line 34 under this condition is shown on line C′ of FIG. 2. From lines C′ and E′ of FIG. 2, it is seen that under this condition, an output pulse is generated which is delayed from the input pulse by an amount equal to the pulse width, and which has a width which is equal to T′. The circuit thus serves to both delay and lengthen the received pulse. The circuit, when operated in this manner, has the character of a delay multivibrator or single-shot and may have some utility and advantages in special situations.

As was indicated previously, situations may exist where it is desired to delay the individual pulses of a regularly spaced pulse train by an amount which varies as a function of time. Such a circuit may be obtained by transferring switches 28 and 30 from the position shown in FIG. 1 to their alternate positions. With the switches in this position, the pulse on line 16 is applied through capacitor 42 to voltage variable capacitor 54. The capacitance of capacitor 54 is controlled by a voltage obtained from $F(t)$ generator 56 through choke coils 58. Coils 58 prevent the pulse on line 16 from affecting generator 56. The output from generator 56 could, for example, be a sine wave or some other variable function of time. The variations in this function should be relatively slow as compared to the input pulses. The output from capacitor 54 is applied through capacitor 60, transferred switch 30 and line 34 to summing point 18. Capacitors 52 and 60 serve to isolate the DC levels from function generator 56 from the remainder of the circuit, and also form part of the total capacitance for the circuit between switches 28 and 30. The outputs from the circuit just described will be the same as those from capacitor 32 except that the decay time of the pulses will be a continuously variable function of time. The position of the output pulse may thus be varied from, for example, the position shown on line E of FIG. 2 to the position shown on line E″ of FIG. 2 which is a maximum delay obtainable from the circuit without altering the pulse shape. This delay is equal to the pulse width.

A circuit has thus been described which is capable of providing variable delays on pulses of varying width and repetition range while not introducing any increase in pulse rise or fall time. The circuit has been described with reference to a transistor embodiment although it is apparent that the cost of the circuit could be even further reduced if integrated circuit or similar techniques were utilized. It is also apparent that other threshold devices could be substituted for transistor 38 and that inverters such as 14 or 22, and 46 could be eliminated if noninverting elements are utilized. It is also apparent that the firing and extinguishing potentials of the threshold circuit need not necessarily be equal if the values of other circuit parameters are adjusted accordingly, and that the parameter values utilized in any given application would depend on the components utilized and the particular results desired.

Therefore, while the invention has been particularly shown and described with reference to a preferred embodiment therefor, it will be understood by those skilled in the art that the foregoing and other changes in form and detail may be made therein without departing from the spirit and scope of the invention.

I claim:

1. A pulse delay circuit comprising:
means responsive to the leading edge of said pulse for generating a first decaying pulse which decays from a peak value to a predetermined first value in a time T1 and responsive to the trailing edge of said pulse for generating a second decaying pulse which decays from a peak value to a predetermined second value in a time T2, said first and second decaying pulses being of opposite polarity;
means for generating a reference pulse of the same polarity as said second decaying pulse, which reference pulse begins and ends at the same time as said pulse;
a summing point;
means for applying to said summing point said first and second decaying pulses and said reference pulse; and
a threshold circuit connected to receive as an input the potential at said summing point, said threshold circuit being adapted to start generating an output when its input is equal to the value of said reference pulse minus said predetermined first value, and to stop generating an output when its input is equal to said predetermined second value.

2. A circuit of the type described in claim 1 wherein said threshold circuit is adapted to start and stop generating an output of the same value.

3. A circuit of the type described in claim 1 wherein T1 and T2 are equal whereby said pulse may be delayed without causing any distortion of its shape.

4. A circuit of the type described in claim 1 wherein T1 and T2 are greater than the duration of said pulse; whereby said circuit functions to both delay and expand said pulse.

5. A circuit of the type described in claim 1 including means for normalizing the amplitude of said pulse as it is applied to the circuit.

6. A circuit of the type as described in claim 1 wherein said decaying pulse-generating means is a capacitor connected to receive said pulse and to apply its output to said summing point.

7. A circuit of the type described in claim 1 wherein said threshold circuit is a transistor.

8. A circuit of the type described in claim 1 including means for varying said times T1 and T2 whereby the time by which said pulse is delayed may be varied.

9. A circuit of the type described in claim 8 wherein said time varying means includes means for continuously changing the delay of pulses applied to said circuit as a function of time.

10. A circuit of the type described in claim 9 wherein said decaying pulse generating means includes a voltage variable capacitor; and wherein said delay changing means includes means for varying the voltage across said capacitor as a function of time.